(12) United States Patent
Lu et al.

(10) Patent No.: US 11,211,574 B2
(45) Date of Patent: Dec. 28, 2021

(54) LIGHT EMITTING DEVICE AND FABRICATION METHOD THEREOF, AND ELECTRONIC APPARATUS

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Junxiang Lu, Beijing (CN); Moli Sun, Beijing (CN); Guiguang Hu, Beijing (CN); Chengjun Liu, Beijing (CN); Shaojun Sun, Beijing (CN); Junyao Yin, Beijing (CN); Xia Chen, Beijing (CN); Yanfei Chi, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

(*) Notice: Subject to any disclaimer, the term of this patent is extended or adjusted under 35 U.S.C. 154(b) by 266 days.

(21) Appl. No.: 16/497,304

(22) PCT Filed: Feb. 15, 2019

(86) PCT No.: PCT/CN2019/075238
§ 371 (c)(1),
(2) Date: Sep. 24, 2019

(87) PCT Pub. No.: WO2020/001040
PCT Pub. Date: Jan. 2, 2020

(65) Prior Publication Data
US 2021/0336170 A1    Oct. 28, 2021

(30) Foreign Application Priority Data
Jun. 28, 2018 (CN) .......................... 201810689588.4

(51) Int. Cl.
*H01L 51/50* (2006.01)
*H01L 51/52* (2006.01)
*H01L 51/56* (2006.01)

(52) U.S. Cl.
CPC ........ *H01L 51/502* (2013.01); *H01L 51/5092* (2013.01); *H01L 51/5218* (2013.01); *H01L 51/5234* (2013.01); *H01L 51/56* (2013.01)

(58) Field of Classification Search
CPC .............. H01L 51/502; H01L 51/5234; H01L 51/5218
See application file for complete search history.

(56) References Cited

U.S. PATENT DOCUMENTS

2004/0135502 A1  7/2004  Kobayashi et al.
2007/0069635 A1  3/2007  Cok
(Continued)

FOREIGN PATENT DOCUMENTS

CN    1893751 A     1/2007
CN    103338544 A   10/2013
(Continued)

OTHER PUBLICATIONS

The First Chinese Office Action dated Jun. 11, 2019; Appln. No. 201810689588.4.

*Primary Examiner* — Anthony Ho

(57) ABSTRACT

A light emitting device and a fabrication method thereof and an electronic apparatus are disclosed. The light emitting device includes: a first electrode, a second electrode, an electroluminescent layer and a quantum dot light conversion layer; the second electrode is provided on the first electrode; the electroluminescent layer and the quantum dot light conversion layer are provided between the first electrode and the second electrode; and the quantum dot light conversion layer is provided at a light output side of the electroluminescent layer, and generates, under being excited by light from the electroluminescent layer, light having a same color (Continued)

as that of light from the electroluminescent layer and having a wavelength range narrower than that of the light from the electroluminescent layer.

20 Claims, 7 Drawing Sheets

(56) References Cited

U.S. PATENT DOCUMENTS

2016/0028035 A1 1/2016 Yang
2016/0380238 A1 12/2016 Ma et al.

FOREIGN PATENT DOCUMENTS

| CN | 103730584 A | 4/2014 |
| CN | 106299150 A | 1/2017 |
| CN | 207250571 U | 4/2018 |
| CN | 108878667 A | 11/2018 |

LIGHT EMITTING DEVICE AND FABRICATION METHOD THEREOF, AND ELECTRONIC APPARATUS

The application claims priority to the Chinese patent application No. 201810689588.4, filed on Jun. 28, 2018, the entire disclosure of which is incorporated herein by reference as part of the present application.

TECHNICAL FIELD

At least one embodiment of the present disclosure relates to a light emitting device and a fabrication method, and an electronic apparatus.

BACKGROUND

An electroluminescent device is a solid-state semiconductor light emitting device that can convert electric energy into light energy and is currently widely used in display and lighting fields, such as a light-emitting diode (LED). A light-emitting material in the electroluminescent device may be classified into an organic light-emitting material and an inorganic light-emitting material. For organic light-emitting diodes (OLEDs), development of the organic light-emitting diode that emits blue light is lagging behind those of the organic light-emitting diode that emits red light and the organic light-emitting diode that emits green light. It is because, on the one hand, there are fewer types of light-emitting materials that emit blue light, and on the other hand, stability of the light-emitting materials that emit blue light is poor, so that OLED white light display or illumination are constrained accordingly.

SUMMARY

At least one embodiment of the present disclosure provides a light emitting device comprising a first electrode, a second electrode, an electroluminescent layer and a quantum dot light conversion layer; the second electrode is on the first electrode; the quantum dot light conversion layer is on a light output side of the electroluminescent layer, and generates, under being excited by light from the electroluminescent layer, light having a same color as that of light from the electroluminescent layer and having a wavelength range narrower than that of the light from the electroluminescent layer.

For example, in the light emitting device provided by at least an embodiment of the present disclosure, the first electrode is an opaque reflective electrode; the second electrode is a transparent electrode or a semi-transparent electrode; and the quantum dot light conversion layer is between the electroluminescent layer and the second electrode.

For example, the light emitting device provided by at least an embodiment of the present disclosure further comprises an electron injection layer between the second electrode and the electroluminescent layer; the quantum dot light conversion layer is between the electron injection layer and the second electrode.

For example, in the light emitting device provided by at least an embodiment of the present disclosure, the second electrode is an opaque reflective electrode; the first electrode is a transparent electrode or a semi-transparent electrode; and the quantum dot light conversion layer is between the first electrode and the electroluminescent layer.

For example, the light emitting device provided by at least an embodiment of the present disclosure further comprises a hole injection layer between the first electrode and the electroluminescent layer; the quantum dot light conversion layer is between the first electrode and the hole injection layer.

For example, in the light emitting device provided by at least an embodiment of the present disclosure, the quantum dot light conversion layer is a carbon nanometer quantum dot layer.

For example, in the light emitting device provided by at least an embodiment of the present disclosure, the light from the electroluminescent layer comprises blue light, and the carbon nanometer quantum dot layer generates blue light under excitation of the blue light from the electroluminescent layer.

For example, in the light emitting device provided by at least an embodiment of the present disclosure, the carbon nanometer quantum dot layer has a thickness of 5 nm to 30 nm.

At least one embodiment of the present disclosure further provides an electronic apparatus comprising the light emitting device according to any one of claims 1 to 8.

For example, in the electronic apparatus provided by at least an embodiment of the present disclosure, the electronic apparatus comprises a light-emitting array; the light-emitting array includes a plurality of light-emitting units; and each of the plurality of light-emitting units comprises the light emitting device.

At least one embodiment of the present disclosure further provides a fabrication method of a light emitting device, and the fabrication method comprises: forming a first electrode, an electroluminescent layer, a quantum dot light conversion layer and a second electrode, in which the second electrode is on the first electrode, the electroluminescent layer and the quantum dot light conversion layer are between the first electrode and the second electrode; the quantum dot light conversion layer is on a light output side of the electroluminescent layer, and generates, under being excited by light from the electroluminescent layer, light having a same color as that of the light from the electroluminescent layer and having a wavelength range narrower than that of the light from the electroluminescent layer.

For example, in the fabrication method of the light emitting device provided by at least an embodiment of the present disclosure, the first electrode is an opaque reflective electrode, and the second electrode is a transparent electrode or a semi-transparent electrode; and the quantum dot light conversion layer is formed between the electroluminescent layer and the second electrode.

For example, the fabrication method of the light emitting device provided by at least an embodiment of the present disclosure further comprises: forming an electron injection layer between the second electrode and the electroluminescent layer, wherein the quantum dot light conversion layer is formed between the electron injection layer and the second electrode.

For example, in the fabrication method of the light emitting device provided by at least an embodiment of the present disclosure, the second electrode is an opaque reflective electrode, and the first electrode is a transparent electrode or a semi-transparent electrode; and the quantum dot light conversion layer is formed between the electroluminescent layer and the first electrode.

For example, in the fabrication method of the light emitting device provided by at least an embodiment of the present disclosure, the second electrode is an opaque reflective electrode, and the first electrode is a transparent electrode or a semi-transparent electrode; and the quantum dot light conversion layer is formed between the electroluminescent layer and the first electrode.

For example, the fabrication method of the light emitting device provided by at least an embodiment of the present disclosure further comprises: forming a hole injection layer between the first electrode and the electroluminescent layer, wherein the quantum dot light conversion layer is formed between the hole injection layer and the first electrode.

For example, in the fabrication method of the light emitting device provided by at least an embodiment of the present disclosure, the quantum dot light conversion layer is a carbon nanometer quantum dot layer.

REFERENCE NUMERALS

Figure 1:
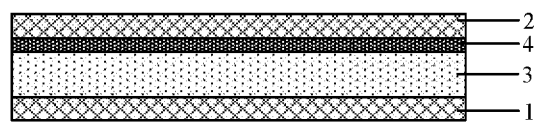
FIG. 1 is a structural schematic diagram of a light emitting device provided by an embodiment of the present disclosure.

1—first electrode; 2—second electrode; 3—electroluminescent layer; 4—quantum dot light conversion layer; 5—electron injection layer; 6—electron transport layer; 7—hole injection layer; 8—hole transport layer; 9—light-emitting unit; 10—light emitting device; 11—pixel defining layer; 14—electronic apparatus; 101—base substrate.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Inside," "outside," "on," "under" and the like are only used to indicate relative position relationship, and when the position of the object which is described is changed, the relative position relationship may be changed accordingly.

The drawings of the present disclosure are not strictly drawn to actual scales; the number of light-emitting units in an electronic apparatus is not limited to the number illustrated in the diagrams; specific sizes and numbers of respective structures may be determined according to actual needs. The drawings described in the present disclosure are merely structural schematic diagrams.

At least one embodiment of the present disclosure provides a light emitting device comprising a first electrode, a second electrode, an electroluminescent layer and a quantum dot light conversion layer. The second electrode, provided on the first electrode; the electroluminescent layer and a quantum dot light conversion layer are between the first electrode and the second electrode; the quantum dot light conversion layer is on a light output side of the electroluminescent layer, and generates, under being excited by light from the electroluminescent layer, light having a same color as that of light from the electroluminescent layer and having a wavelength range narrower than that of the light from the electroluminescent layer.

Exemplarily, FIG. 1 is a structural schematic diagram of a light emitting device provided by an embodiment of the present disclosure. As illustrated in FIG. 1, the light emitting device 10 comprises a first electrode 1, a second electrode 2, an electroluminescent layer 3 and a quantum dot light conversion layer 4. The second electrode 2 is provided on the first electrode 1, and the electroluminescent layer 3 and the quantum dot light conversion layer 4 are provided between the first electrode 1 and the second electrode 2. The electroluminescent layer 3 can emit light when a voltage is applied to the electroluminescent layer 3, for example, a high-level signal is applied to the first electrode 1, and a low-level signal is applied to the second electrode 2. Of course, in other embodiments, a low-level signal may be applied to a first electrode 1 and a high-level signal may be applied to a second electrode 2, which is not be limited in the embodiment of the present disclosure. The quantum dot light conversion layer 4 is provided on a light output side of the electroluminescent layer 3, that is, light emitted from the electroluminescent layer 3 needs to pass through the quantum dot light conversion layer 4 before being emitted to an external environment. For example, in the embodiment illustrated in FIG. 1, the first electrode 1 is an opaque reflective electrode, and the second electrode 2 is a transparent electrode or a semi-transparent electrode, in this case, the light output side of the electroluminescent layer 3 is a side away from the first electrode 1, and the light emitting device 10 is of top-emitting type. The light from the electroluminescent layer 3 is incident on the quantum dot light conversion layer 4, and the quantum dot light conversion layer 4, and generates, under being excited by the light from the electroluminescent layer 3, light having a same color as that of the light from the electroluminescent layer 3 and having a wavelength range narrower than that of the light from the electroluminescent layer 3. Thus, the monochromatic light from the electroluminescent layer 3 is converted into light of the same color as that of the monochromatic light from the electroluminescent layer 3 and higher color purity than that of the monochromatic light from the electroluminescent layer 3 by the quantum dot light conversion layer 4. For example, the light emitted from the electroluminescent layer 3 includes blue light, and the quantum dot light conversion layer 4 can convert the blue light into blue light having higher color purity. The light emitting device 10 provided by the embodiment of the present disclosure can improve quality of the monochromatic light by the quantum dot light conversion layer 4, so that the monochromatic light can achieve higher color purity. For example, displaying by light emitted through the quantum dot light conversion layer 4, a higher color gamut can be obtained, and display quality is improved. In addition, as a light-emitting material of the electroluminescent layer 3 ages, the color purity of the light emitted from the electroluminescent layer 3 is decrease; and the light emitting device 10 provided by the embodiment of the present disclosure can improve the quality of monochromatic light by the quantum dot light conversion layer 4, so as to achieve required color purity, thereby improving light-emitting performance of the light emitting device 10, and prolonging a service life of the light emitting device 10.

For example, in the embodiment illustrated in FIG. 1, the first electrode 1 is made of a metal material, and the metal material may be, for example, magnesium, aluminum, silver, a magnesium aluminum alloy or a magnesium silver alloy, and so on. Alternatively, the first electrode 1 include a transparent electrode made of a transparent conductive material, and a reflective metal layer located on the transparent electrode; and the reflective metal layer may be made of the above-described metal material. For example, the second electrode 2 is made of a transparent conductive material, and the transparent conductive material is, for example, indium tin oxide (ITO), indium zinc oxide (IZO), aluminum-doped zinc oxide (AZO) or fluorine-doped tin oxide (FTO), and so on. Of course, materials of the first electrode 1, the reflective metal layer and the second electrode 2 are not limited to the types listed above, which are not be limited in the embodiment of the present disclosure.

For example, the electroluminescent layer 3 is an inorganic light-emitting layer or an organic light-emitting layer. For example, hereinafter it is described with a case where the electroluminescent layer 3 is an organic light-emitting layer so that the light emitting device is an organic light-emitting diode (OLED) device as an example.

For example, the quantum dot light conversion layer 4 is a nanometer quantum dot layer. Quantum dot is a low-dimensional semiconductor material whose sizes in three dimensions thereof are not more than twice the exciton Bohr radius of a semiconductor material corresponding thereto. A quantum dot usually has a spherical or spheroidal shape, and has a radial size usually on a nanometer scale. The quantum dot has unique optoelectronic characteristics. The quantum dot has a characteristic that when excited by electricity or light, it emits light, generate bright light and pure color light; and a color of the light emitted by the quantum dot is determined by the composition material, size and shape of the quantum dot. For example, a material of the quantum dot may be zinc sulfide, gallium nitride, zinc selenide, cadmium sulfide, cadmium selenide, cadmium telluride, gallium arsenide, lead telluride, carbon, and so on. In the light emitting device 10 provided by the embodiment of the present disclosure, after the light from the electroluminescent layer 3 enters the nanometer quantum dot layer, the nanometer quantum dot layer is excited by the monochromatic light (for example, blue light) from the electroluminescent layer 3 to generate monochromatic light having a narrower wavelength range (that is, higher color purity) than that of the light from the electroluminescent layer 3 and having a same color as that of the light from the electroluminescent layer 3.

For example, the light from the electroluminescent layer 3 includes blue light, a wavelength range of the blue light band is from 400 nm to 450 nm; and the nanometer quantum dot layer can convert the blue light from the electroluminescent layer 3 into blue light having higher color purity to increase the color purity of the blue light from the electroluminescent layer 3, and improve quality of the blue light emitted from the electroluminescent layer 3. For example, a wavelength of the light from the electroluminescent layer 3 is less than a wavelength of the light generated by the nanometer quantum dot layer, such that the light from the electroluminescent layer 3 has a higher energy to excite the nanometer quantum dot layer. For example, the blue light from the electroluminescent layer 3 has a wavelength range of 400 nm to 430 nm, and the blue light generated by the nanometer quantum dot layer has a wavelength range of 430 nm to 440 nm. For another example, the blue light from the electroluminescent layer 3 has a wavelength range of 400 nm to 430 nm, and the blue light emitted by the nanometer quantum dot layer has a wavelength range of 420 nm to 440 nm. Of course, the wavelength range of the blue light from the electroluminescent layer 3 and the wavelength range of the blue light emitted by the nanometer quantum dot layer are not be limited in the embodiment of the present disclosure. As compared with light such as red light and green light, blue light has a shorter wavelength and higher energy, so a light-emitting material that emits blue light usually ages prior to a light-emitting material that emits red light and a light-emitting material that emits green light; at least one embodiment of the present disclosure can improve light-emitting performance of a light emitting device that emits blue light, so as to prolong a service life thereof.

Blue light has higher energy, which, thus, is apt to cause decay of a material; compared with organic light-emitting materials that emit red light and green light, an organic light-emitting material that emits blue light ages faster; for example, in a display device having red light-emitting units, green light-emitting units and blue light-emitting units, insufficiency or low color purity of blue light may result in shortcomings such as narrowing of a color gamut and yellowing of a display picture. The light emitting device provided by at least one embodiment of the present disclosure can increase the color purity of the blue light, so that even when the quality of the blue light emitted from the electroluminescent layer is degraded, blue light with better color purity can be obtained as well, so as to prolong the service life of the light emitting device that emits blue light, and reduce or avoid the above-described shortcomings.

For example, the above-described nanometer quantum dot layer is a carbon nanometer quantum dot layer, that is, the quantum dot light conversion layer 4 is a carbon nanometer quantum dot layer. In the electroluminescent device, if the carrier mobility is low, the luminous efficiency is lowered, so it is necessary to increase the carrier mobility in the light emitting device. The carbon nanometer quantum dot layer has higher electron mobility, and can improve the carrier mobility, which is favorable for combining more electrons with holes in the electroluminescent layer 3 to excite emission of light with higher intensity, and to improve the light-emitting performance of the light emitting device. For example, with respect to the organic light-emitting material that emits blue light, higher energy possessed by the blue light corresponds to a wider band gap of the organic light-emitting material that emits blue light, which means that the organic light-emitting material that emits blue light has a high LUMO energy level and a low HOMO energy level, so that a great energy level difference exists between the electroluminescent layer 3 and an electrode (which is the second electrode 2 in FIG. 1) have, which is not favorable for carrier injection, thus affecting the light-emitting performance of the electroluminescent layer 3. In the light emitting device provided by the embodiment of the present disclosure, the carbon nanometer quantum dot layer can, in addition to improving the color purity of the light emitting device as described above, further make electrons from the second electrode 2 cross over an energy level potential barrier between the second electrode 2 and the electroluminescent layer 3 more easily to enter the electroluminescent layer 3, so as to excite emission of light with a higher intensity. In addition, the carbon nanometer quantum dot layer is non-toxic and has little environmental hazard.

For example, a carbon nanometer quantum dot in the carbon nanometer quantum dot layer has a spherical shape, and has a diameter of about 8 nm, so as to emit the above-described blue light.

For example, in the embodiment illustrated in FIG. 1, the quantum dot light conversion layer 4 is located between the electroluminescent layer 3 and the second electrode 2. For example, the quantum dot light conversion layer 4 is a carbon nanometer quantum dot layer, the carbon nanometer quantum dot layer has relatively high carrier mobility, and is in contact with the second electrode 2; when a low-level signal is applied to the second electrode 2 and a high-level signal is applied to the first electrode 1, the second electrode 2 is a cathode, and the first electrode 1 is an anode. In this case, it is equivalent to that the carbon nanometer quantum dot layer and the second electrode 2 together constitute a composite cathode to assist electron transport. Electrons from the second electrode 2 enter the carbon nanometer quantum dot layer, and the carbon nanometer quantum dot layer can increase the electron mobility, and make the electrons cross over the energy level potential barrier between the second electrode 2 and the electroluminescent layer 3 more easily to be transported into the electroluminescent layer 3, so that more electrons are combined with holes in the electroluminescent layer 3 to excite emission of light of a higher intensity, and to improve the light-emitting performance of the light emitting device.

For example, the carbon nanometer quantum dot layer has a thickness of about 5 nm to 30 nm. If the thickness of the carbon nanometer quantum dot layer is too large, a thickness of the light emitting device 10 is increased, which is not favorable for thinning the electronic apparatus adopting the light emitting device 10. If the thickness of the carbon nanometer quantum dot layer is too small, it cannot be excited to emit light of the specific wavelength range.

Figure 2:
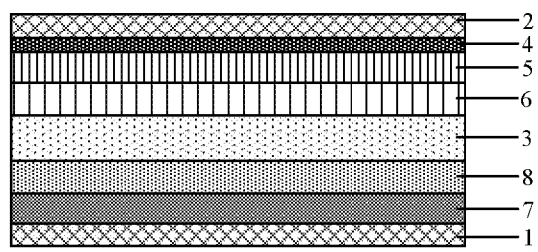
FIG. 2 is a structural schematic diagram of another light emitting device provided by an embodiment of the present disclosure.

For example, FIG. 2 is a structural schematic diagram of another light emitting device provided by an embodiment of the present disclosure. As illustrated in FIG. 2, the light emitting device 10 differs from the light emitting device illustrated in FIG. 1 in that the light emitting device 10 further comprises an electron injection layer 5 and an electron transport layer 6; the electron injection layer 5 is located between a second electrode 2 and an electroluminescent layer 3; the electron transport layer 6 is located between the electron injection layer 5 and the electroluminescent layer 3; and a quantum dot light conversion layer 4 is located between the electron injection layer 5 and the second electrode 2. With respect to the electron injection layer 5 and the electron transport layer 6, those skilled in the art may refer to conventional technologies. The light emitting device can achieve the same technical effect as the light emitting device illustrated in FIG. 1 in terms of improving light-emitting performance of the light emitting device. For example, the quantum dot light conversion layer 4 is a carbon nanometer quantum dot layer located between the electron injection layer 5 and the second electrode 2, and the carbon nanometer quantum dot layer can improve the color purity of the light emitting device 10. Further, for example, the carbon nanometer quantum dot layer and the second electrode 2 together constitute a composite cathode to assist the electron transport. Electrons from the second electrode 2 enter the carbon nanometer quantum dot layer, and the carbon nanometer quantum dot layer can increase electron mobility, and make the electrons cross over an energy level potential barrier between the second electrode 2 and the electron injection layer 5 more easily to be transported into the electroluminescent layer 3, so that more electrons are combined with holes in the electroluminescent layer 3 to excite emission of light of a higher intensity, and to improve the light-emitting performance of the light emitting device. For example, the electron transport layer 6 may not be provided such that the electron injection layer 5 is in direct contact with the electroluminescent layer 3. Other features of the light emitting device illustrated in FIG. 2 are the same as those of the light emitting device illustrated in FIG. 1, and can be referred to the foregoing description, and no details is repeated here.

Figure 3:
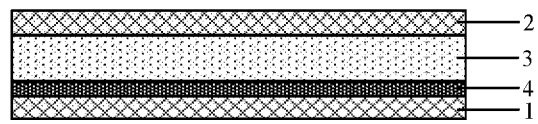
FIG. 3 is a structural schematic diagram of still another light emitting device provided by an embodiment of the present disclosure.

For example, FIG. 3 is a structural schematic diagram of still another light emitting device according to an embodiment of the present disclosure. As illustrated in FIG. 3, the light emitting device 10 differs from the light emitting device illustrated in FIG. 1 in that in the light emitting device 10, a second electrode 2 is an opaque reflective electrode, and a first electrode 1 is a transparent electrode or a semi-transparent electrode; and in this case, a light output side of an electroluminescent layer 3 is a side facing the first electrode 1, that is, the light emitting device 10 is of a bottom-emitting type, and a quantum dot light conversion layer 4 is located between the first electrode 1 and the electroluminescent layer 3. The light emitting device can achieve the same technical effect as the light emitting device illustrated in FIG. 1 in terms of improving light-emitting performance of the light emitting device, for which the foregoing description may be referred to.

In the embodiment illustrated in FIG. 3, for example, when a high-level signal is applied to the first electrode and a low-level signal is applied to the second electrode, the second electrode 2 is a cathode and the first electrode 1 is an anode. In this case, for example, the quantum dot light conversion layer 4 is a carbon nanometer quantum dot layer. The carbon nanometer quantum dot layer used as the quantum dot light conversion layer 4, together with the first electrode 1, constitutes a composite anode to assist hole transport. Holes from the first electrode 1 enter the carbon nanometer quantum dot layer, the carbon nanometer quantum dot layer has higher hole mobility and can improve hole mobility and make the holes cross over an energy level potential barrier between the first electrode 1 and the electroluminescent layer 3 more easily to be transported into the electroluminescent layer 3, so that more holes can be combined with electrons in the electroluminescent layer 3 to excite emission of light with a higher intensity, and to improve the light-emitting performance of the light emitting device. Other features of the light emitting device illustrated in FIG. 3 are the same as those of the light emitting device illustrated in FIG. 1, for which the foregoing description may be referred to, and no details will be repeated here.

Figure 4:
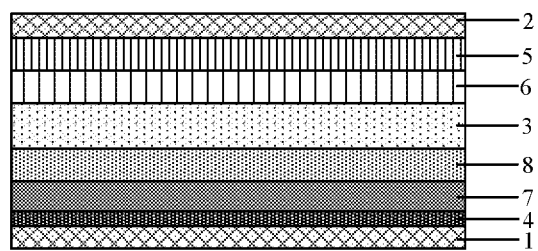
FIG. 4 is a structural schematic diagram of further another light emitting device provided by an embodiment of the present disclosure.

For example, FIG. 4 is a structural schematic diagram of a further light emitting device provided by an embodiment of the present disclosure. As illustrated in FIG. 4, the light emitting device 10 differs from the light emitting device illustrated in FIG. 3 in that, the light emitting device 10 further comprises a hole injection layer 7 and a hole transport layer 8; the hole injection layer 7 is located between a first electrode 1 and an electroluminescent layer 3; the hole transport layer 8 is located between the hole injection layer 7 and the electroluminescent layer 3; and a quantum dot light conversion layer 4 is located between the first electrode 1 and the hole injection layer 7. With respect to the hole injection layer 7 and the hole transport layer 8, those skilled in the art may refer to conventional technologies. The light emitting device can achieve the same technical effect as the light emitting device illustrated in FIG. 1 in terms of improving the light-emitting performance of the light emitting device, for which the foregoing description may be referred to.

In the embodiment illustrated in FIG. 4, for example, the quantum dot light conversion layer 4 is a carbon nanometer quantum dot layer located between the hole injection layer 7 and the first electrode 1; the carbon nanometer quantum dot layer and the first electrode 1 together constitute a composite anode to assist hole transport. Holes from the first electrode 1 enter the carbon nanometer quantum dot layer, and the carbon nanometer quantum dot layer can improve hole mobility and make the holes cross over an energy level potential barrier between the first electrode 1 and the hole injection layer 7 more easily to be transported into the electroluminescent layer 3, so that more holes can be combined with electrons in the electroluminescent layer 3, to excite emission of light of a higher intensity, and to improve the light-emitting performance of the light emitting device. For example, in another embodiment, a hole transport layer 8 may not be provided such that a hole injection layer 7 is in direct contact with an electroluminescent layer 3. Other features of the light emitting device illustrated in FIG. 4 are the same as those of the light emitting device illustrated in FIG. 3, for which the foregoing description may be referred to, and no details will be repeated here.

Of course, in another embodiment of the present disclosure, a carbon nanometer quantum dot layer is provided between a first electrode 1 and a hole injection layer 7, and another carbon nanometer quantum dot layer is provided between a second electrode 2 and an electron injection layer 5, to improve both electron mobility and hole mobility, while achieving the above-described technical effect of improving the color purity of the light emitting device.

Figure 5:
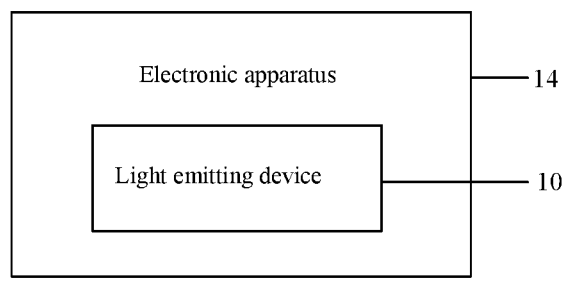
FIG. 5 is a schematic diagram of an electronic apparatus provided by an embodiment of the present disclosure.

At least one embodiment of the present disclosure further provides an electronic apparatus, the electronic apparatus comprises any one of the light emitting devices provided by the embodiments of the present disclosure. Exemplarily, FIG. 5 is a schematic diagram of an electronic apparatus provided by an embodiment of the present disclosure. As illustrated in FIG. 5, the electronic apparatus 14 comprises any one of the light emitting devices 10 provided by the embodiments of the present disclosure. Other technical features of the electronic apparatus 14 are not limited in the embodiment of the present disclosure. For example, the electronic apparatus 14 may be a display device or a lighting device. The display apparatus may be, for example, an OLED display apparatus. For example, the display device may be a mobile phone, a tablet personal computer, a television, a monitor, a laptop, a digital photo frame, a navigator, and so on. The display apparatus provided by the embodiment of the present disclosure has a wider color gamut, and the light emitting device of the display apparatus has better light-emitting performance and a longer service life.

Figure 6:
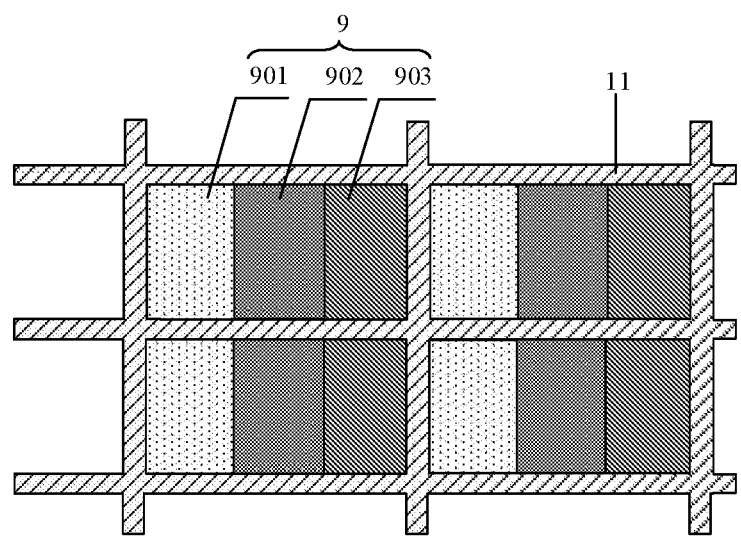
FIG. 6 is a partial plan schematic diagram of a light-emitting array of the electronic apparatus provided by an embodiment of the present disclosure.

For example, FIG. 6 is a partial plan schematic diagram of a light-emitting array of the electronic apparatus provided by the embodiment of the present disclosure. As illustrated in FIG. 6, in the electronic apparatus provided by the embodiment of the present disclosure, the electronic apparatus 14 comprises the light-emitting array; the light-emitting array includes a plurality of light-emitting units 9 and a pixel defining layer 11 which defines the plurality of light-emitting units 9. Each of the plurality of light-emitting units 9 includes any one of the light emitting devices provided by the embodiments of the present disclosure. With respect to other structures of the light-emitting array (for example, a driving element such as a drive transistor, a gate line, a data line, and so on), conventional technologies may be referred to. For example, each of the plurality of light-emitting units 9 includes a plurality of sub-light-emitting units. For example, in one embodiment of the present disclosure, the plurality of sub-light-emitting units included by each of the plurality of light-emitting units 9 include a red light-emitting units 901, a green light-emitting unit 902, and a blue light-emitting unit 903. An electroluminescent layer in the red light-emitting unit 901 emits red light, an electroluminescent layer in the green light-emitting unit 902 emits green light, and an electroluminescent layer in the blue light-emitting unit 903 emits blue light; at least the blue light-emitting unit 903 includes the light emitting device such that blue light emitted from the blue light-emitting unit 903 has higher color purity, and the blue light with higher color purity emitted from the blue light-emitting unit 903, together with red light emitted from the red light-emitting unit 901 and green light emitted from the green light-emitting unit 902, form a wider color gamut. Moreover, when a light-emitting material that emits blue light in the blue light-emitting unit 903 ages prior to a light-emitting material in the red light-emitting unit 901 and a light-emitting material in the green light-emitting unit 902, the light-emitting performance of the light emitting device in the blue light-emitting unit 903 can be improved, so as to prolong the service life of the light emitting device.

At least one embodiment of the present disclosure further provides a fabrication method of a light emitting device, the fabrication method comprises: forming a first electrode, an electroluminescent layer, a quantum dot light conversion layer and a second electrode. The second electrode is located above the first electrode; the electroluminescent layer and the quantum dot light conversion layer are located between the first electrode and the second electrode; and the quantum dot light conversion layer is provided on a light output side of the electroluminescent layer and, and generates, under being excited by the light from the electroluminescent layer, light having a same color as that of the light from the electroluminescent layer and having a wavelength range narrower than that of the light from the electroluminescent layer.

For example, in one embodiment of the present disclosure, the first electrode is an opaque reflective electrode, and the second electrode is a transparent electrode or a semi-transparent electrode; and the quantum dot light conversion layer is formed between a light emitting layer and the second electrode.

Figure 7A:
FIG. 7A to FIG. 7D are schematic diagrams of a fabrication method of a light emitting device provided by an embodiment of the present disclosure.

Exemplarily, FIG. 7A to FIG. 7D are schematic diagrams of a fabrication method of a light emitting device provided by an embodiment of the present disclosure. As illustrated in FIG. 7A, a base substrate 101 is provided, and a first electrode 1 is formed on the base substrate 101. For example, the base substrate 101 may be a glass substrate or a plastic substrate, etc. For example, the first electrode 1 is an opaque reflective electrode, and is made of an opaque metal material, for which the description in the foregoing embodiment may be referred to specifically. For example, the first electrode 1 may be formed by using an evaporation method, and the like.

Figure 7B:
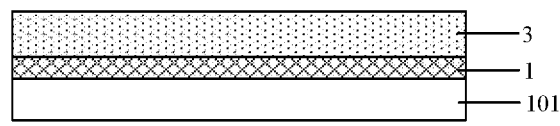

As illustrated in FIG. 7B, an electroluminescent layer 3 is formed on the first electrode 1. For example, the electroluminescent layer 3 is an organic light-emitting layer or an inorganic light-emitting layer. For example, the electroluminescent layer 3 emits blue light. For example, the electroluminescent layer 3 is formed by using a semiconductor process.

Figure 7C:
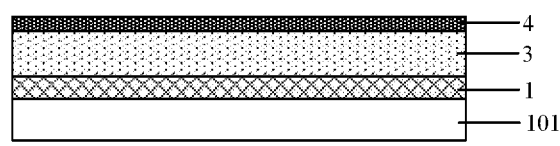

As illustrated in FIG. 7C, a quantum dot light conversion layer 4 is formed on the electroluminescent layer 3. For example, the quantum dot light conversion layer 4 is a carbon nanometer quantum dot layer, which may be formed by using an inkjet printing method. For example, the carbon nanometer quantum dot layer is a quantum dot layer that can emit blue light. For example, a carbon nanometer quantum dot in the carbon nanometer quantum dot layer has a spherical shape, and has a diameter of about 8 nm. The description of the foregoing embodiment may be referred to for features such as the wavelength of the blue light.

Figure 7D:
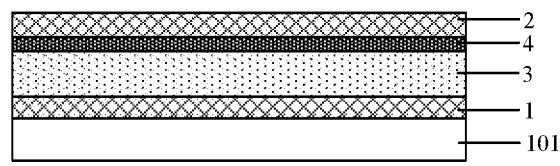

As illustrated in FIG. 7D, a second electrode 2 is formed on the quantum dot light conversion layer 4. For example, the second electrode 2 is a transparent electrode or a semi-transparent electrode. The foregoing description may be referred to for a material of the second electrode 2. For example, the second electrode 2 is formed by using a method such as chemical vapor deposition.

For example, in an embodiment of the present disclosure, the fabrication method of a light emitting device further comprises: forming an electron injection layer between a second electrode and an electroluminescent layer, in which a quantum dot light conversion layer is formed between the electron injection layer and the second electrode. The fabrication method may further comprise: forming a hole injection layer between a first electrode and the electroluminescent layer, and forming a hole transport layer between the hole injection layer and the electroluminescent layer.

Figure 8A:
FIG. 8A to FIG. 8H are schematic diagrams of a fabrication method of another light emitting device provided by an embodiment of the present disclosure.

Exemplarily, FIG. 8A to FIG. 8H are schematic diagrams of a fabrication method of another light emitting device provided by an embodiment of the present disclosure. As illustrated in FIG. 8A, a first electrode 1 is formed by using the same method as that in FIG. 7A.

Figure 8B:
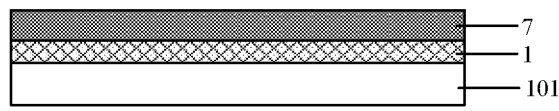
Figure 8C:
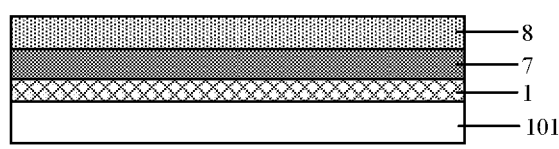

As illustrated in FIG. 8B, a hole injection layer 7 is formed on the first electrode 1. For example, in order to increase hole mobility, a carbon nanometer quantum dot layer may be further formed on the first electrode 1 before the hole injection layer 7 is formed. As illustrated in FIG. 8C, a hole transport layer 8 is formed on the hole injection layer 7. For specific fabrication methods of the hole injection layer 7 and the hole transport layer 8, those skilled in the art may refer to conventional technologies in the art.

Figure 8D:
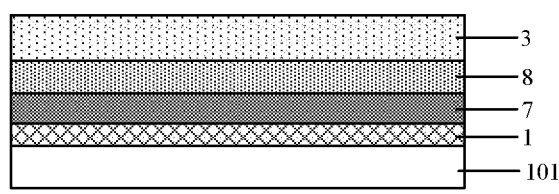

As illustrated in FIG. 8D, an electroluminescent layer 3 is formed on the hole transport layer 8. A specific method of the electroluminescent layer 3 may be referred to the description of FIG. 7B.

Figure 8E:
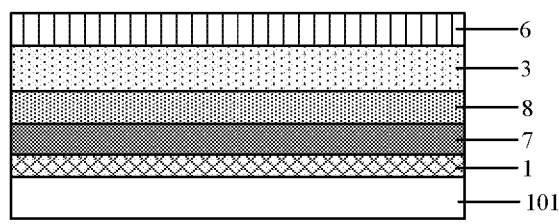
Figure 8F:
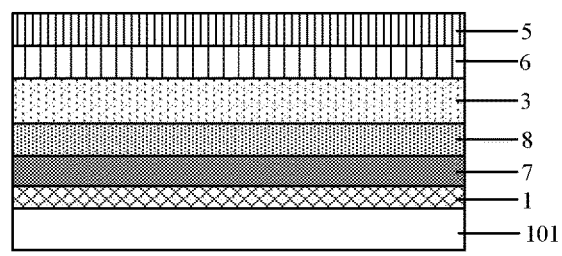
Figure 8G:
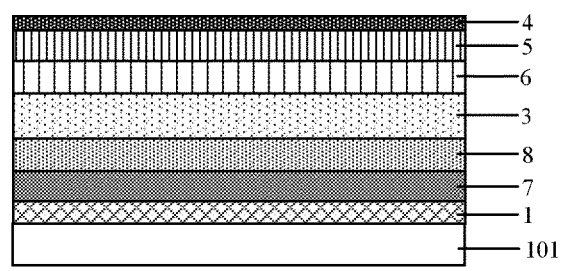

As illustrated in FIG. 8E, an electron transport layer 6 is formed on the electroluminescent layer 3. As illustrated in FIG. 8F, an electron injection layer 5 is formed on the electron transport layer 6. For specific fabrication methods of the electron transport layer 6 and the electron injection layer 5, those skilled in the art may refer to conventional technologies in the art.

As illustrated in FIG. 8Q a quantum dot light conversion layer 4 is formed on the electron injection layer 5. A specific method for the quantum dot light conversion layer 4 may be referred to the description of FIG. 7C and is not repeated here.

Figure 8H:
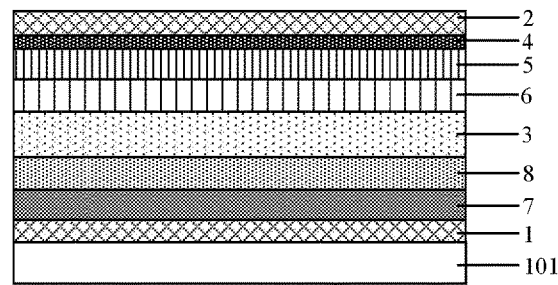

As illustrated in FIG. 8H, a second electrode 2 is formed on the quantum dot light conversion layer 4 by using the same method as that in FIG. 7D.

For example, in one embodiment of the present disclosure, a second electrode is an opaque reflective electrode, the first electrode is a transparent electrode or a semi-transparent electrode; and the quantum dot light conversion layer is formed between the electroluminescent layer and the first electrode.

Figure 9A:
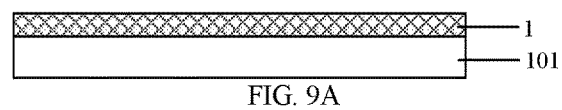
FIG. 9A to FIG. 9D are schematic diagrams of a fabrication method of still another light emitting device provided by an embodiment of the present disclosure.

Exemplarily, FIG. 9A to FIG. 9D are schematic diagrams of a fabrication method of still another light emitting device provided by an embodiment of the present disclosure. As illustrated in FIG. 9A, a first electrode 1 is formed by using the same method as that in FIG. 7A.

Figure 9B:
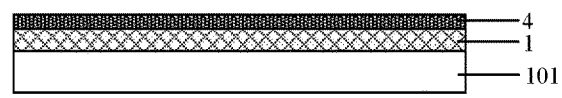

As illustrated in FIG. 9B, a quantum dot light conversion layer 4 is formed on the first electrode 1. A specific method of the quantum dot light conversion layer 4 may be referred to the description of FIG. 7C and is not repeated here.

Figure 9C:
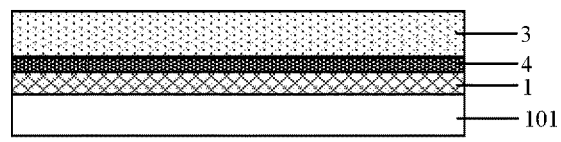

As illustrated in FIG. 9C, an electroluminescent layer 3 is formed on the quantum dot light conversion layer 4. A specific method of the electroluminescent layer 3 may be referred to the description of FIG. 7B.

Figure 9D:
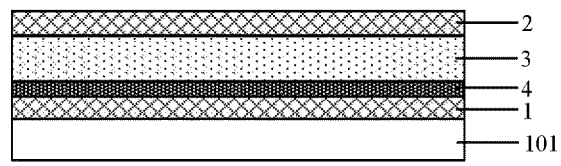

As illustrated in FIG. 9D, a second electrode 2 is formed on the electroluminescent layer 3. The material and method of the second electrode 2 may be referred to the description of FIG. 7D.

For example, in one embodiment of the present disclosure, a fabrication method of a light emitting device further comprises: forming a hole injection layer between a first electrode and an electroluminescent layer, a quantum dot light conversion layer being formed between the hole injection layer and the first electrode. For example, the fabrication method further comprises forming an electron injection layer between a second electrode and the electroluminescent layer, and forming an electron transport layer between the electron injection layer and the electroluminescent layer.

Figure 10A:
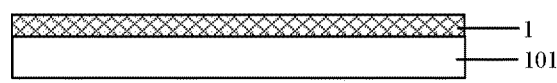
FIG. 10A to FIG. 10H are schematic diagrams of a fabrication method of a further light emitting device provided by an embodiment of the present disclosure.

Exemplarily, FIG. 10A to FIG. 10H are schematic diagrams of a fabrication method of a further light emitting device provided by an embodiment of the present disclosure. As illustrated in FIG. 10A, a first electrode 1 is formed by using a same method as that in FIG. 7A.

Figure 10B:
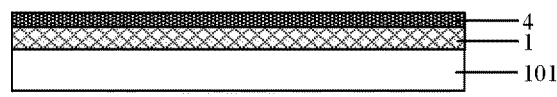

As illustrated in FIG. 10B, a quantum dot light conversion layer 4 is formed on the first electrode 1. A specific method of the quantum dot light conversion layer 4 may be referred to the description of FIG. 7C and is not repeated here.

Figure 10C:
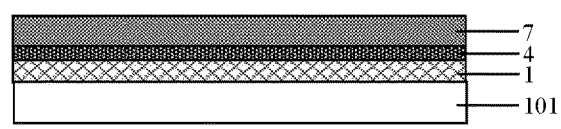
Figure 10D:
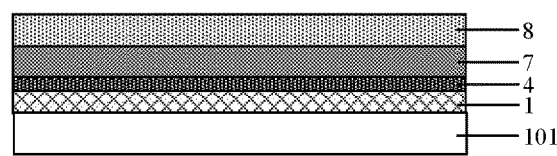

As illustrated in FIG. 10C, a hole injection layer 7 is formed on the quantum dot light conversion layer 4. As illustrated in FIG. 10D, a hole transport layer 8 is formed on the hole injection layer 7. For specific fabrication methods of the hole injection layer 7 and the hole transport layer 8, those skilled in the art may refer to conventional technologies in the art.

Figure 10E:
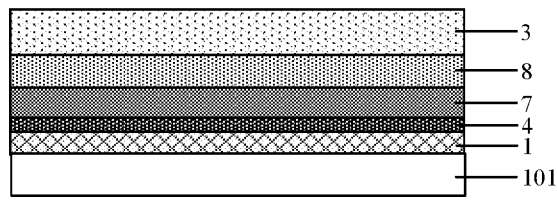

As illustrated in FIG. 10E, an electroluminescent layer 3 is formed on the hole transport layer 8. For a specific method of the electroluminescent layer 3 may be referred to the description of FIG. 7B.

Figure 10F:
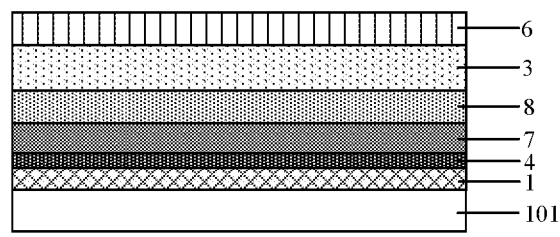
Figure 10G:
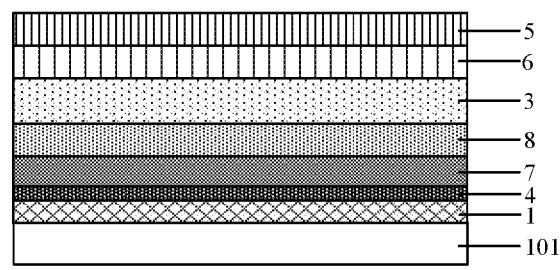

As illustrated in FIG. 10F, an electron transport layer 6 is formed on the electroluminescent layer 3. As illustrated in FIG. 0G, an electron injection layer 5 is formed on the electron transport layer 6. For example, in order to increase electron mobility, a carbon nanometer quantum dot layer is formed on the electron injection layer 5 after the electron injection layer is formed. For specific fabrication methods of the electron transport layer 6 and the electron injection layer 5, those skilled in the art may refer to conventional technologies in the art.

Figure 10H:
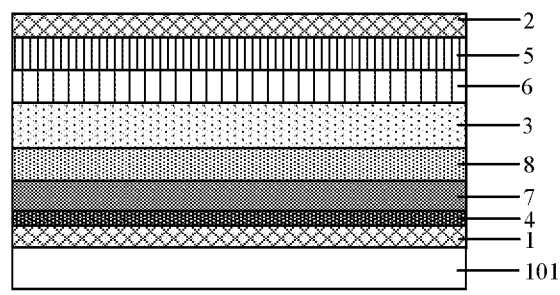

As illustrated in FIG. 10H, a second electrode 2 is formed on the electron injection layer 5. The material of the second electrode 2 and the method of forming the second electrode 2 may be referred to the description of FIG. 7D.

The above is only an exemplary embodiment of the present invention, and is not intended to limit the scope of the present invention. The scope of the present invention is defined by the appended claims.

The invention claimed is:

1. A light emitting device, comprising:
a first electrode;
a second electrode on the first electrode; and
an electroluminescent layer and a quantum dot light conversion layer which are between the first electrode and the second electrode, wherein
the quantum dot light conversion layer is on a light output side of the electroluminescent layer, and generates, under being excited by light from the electroluminescent layer, light having a same color as that of the light from the electroluminescent layer and having a wavelength range narrower than that of the light from the electroluminescent layer.

2. The light emitting device according to claim 1, wherein the first electrode is an opaque reflective electrode;
the second electrode is a transparent electrode or a semi-transparent electrode; and
the quantum dot light conversion layer is between the electroluminescent layer and the second electrode.

3. The light emitting device according to claim 2, further comprising:
an electron injection layer between the second electrode and the electroluminescent layer,
wherein the quantum dot light conversion layer is between the electron injection layer and the second electrode.

4. The light emitting device according to 2, wherein the quantum dot light conversion layer is a carbon nanometer quantum dot layer.

5. The light emitting device according to claim 1, wherein the second electrode is an opaque reflective electrode;
the first electrode is a transparent electrode or a semi-transparent electrode; and
the quantum dot light conversion layer is between the first electrode and the electroluminescent layer.

6. The light emitting device according to claim 5, further comprising:
a hole injection layer between the first electrode and the electroluminescent layer,
wherein the quantum dot light conversion layer is between the first electrode and the hole injection layer.

7. The light emitting device according to claim 1, wherein the quantum dot light conversion layer is a carbon nanometer quantum dot layer.

8. The light emitting device according to claim 7, wherein the light from the electroluminescent layer comprises blue light, and the carbon nanometer quantum dot layer generates blue light under excitation of the blue light from the electroluminescent layer.

9. The light emitting device according to claim 7, wherein the carbon nanometer quantum dot layer has a thickness of 5 nm to 30 nm.

10. The light emitting device according to claim 8, wherein a wavelength of the blue light from the electroluminescent layer is less than a wavelength of the blue light generated by the nanometer quantum dot thin film layer.

11. The light emitting device according to claim 10, wherein the blue light from the electroluminescent layer has a wavelength range of 400 nm to 430 nm, and the blue light generated by the nanometer quantum dot thin film layer has a wavelength range of 430 nm to 440 nm.

12. The light emitting device according to claim 10, wherein the blue light from the electroluminescent layer has a wavelength range of 400 nm to 430 nm, and the blue light emitted by the nanometer quantum dot thin film layer has a wavelength range of 420 nm to 440 nm.

13. An electronic apparatus, comprising the light emitting device according to claim 1.

14. The electronic apparatus according to claim 13, comprising a light-emitting array; the light-emitting array includes a plurality of light-emitting units; and each of the plurality of light-emitting units comprises the light emitting device.

15. A fabrication method of a light emitting device, comprising:
forming a first electrode, an electroluminescent layer, a quantum dot light conversion layer and a second electrode, wherein the second electrode is on the first electrode; the electroluminescent layer and the quantum dot light conversion layer are between the first electrode and the second electrode; the quantum dot light conversion layer is on a light output side of the electroluminescent layer, and generates, under being excited by light from the electroluminescent layer, light having a same color as that of the light from the electroluminescent layer and having a wavelength range narrower than that of the light from the electroluminescent layer.

16. The fabrication method of the light emitting device according to claim 15, wherein
the first electrode is an opaque reflective electrode, and the second electrode is a transparent electrode or a semi-transparent electrode; and
the quantum dot light conversion layer is formed between the electroluminescent layer and the second electrode.

17. The fabrication method of the light emitting device according to claim 16, further comprising:
forming an electron injection layer between the second electrode and the electroluminescent layer, wherein the quantum dot light conversion layer is formed between the electron injection layer and the second electrode.

18. The fabrication method of the light emitting device according to claim 15, wherein
the second electrode is an opaque reflective electrode, and the first electrode is a transparent electrode or a semi-transparent electrode; and the quantum dot light conversion layer is formed between the electroluminescent layer and the first electrode.

19. The fabrication method of the light emitting device according to claim 18, further comprising:
forming a hole injection layer between the first electrode and the electroluminescent layer, wherein the quantum dot light conversion layer is formed between the hole injection layer and the first electrode.

20. The fabrication method of the light emitting device according to claim 15, wherein the quantum dot light conversion layer is a carbon nanometer quantum dot layer.

\* \* \* \* \*